March 10, 1959 L. D. ARMSTRONG ET AL 2,877,396
SEMI-CONDUCTOR DEVICES
Filed Jan. 25, 1954

INVENTORS
LORNE D. ARMSTRONG &
RALPH L. SHERWOOD
BY J. L. Whittaker
ATTORNEY

United States Patent Office 2,877,396

Patented Mar. 10, 1959

2,877,396

SEMI-CONDUCTOR DEVICES

Lorne D. Armstrong, Princeton, and Ralph L. Sherwood, Mercerville, N. J., assignors to Radio Corporation of America, a corporation of Delaware Application January 25, 1954, Serial No. 405,696

4 Claims. (Cl. 317—239)

This invention relates to semi-conductor devices and more particularly to improved methods of securing leads to electrodes of alloy type and other semi-conductor devices having relatively large area electrodes.

Many semi-conductor devices comprise bases of crystalline semi-conductive material and large area metallic rectifying electrodes intimately joined to the bases. The electrodes may be electroplated, soldered, alloyed or otherwise maintained in intimate contact with the surface of the bases. In general such devices distinguish from other semi-conductor devices in that they comprise rectifying barriers of appreciable area. Other devices utilize point contact rectifying probes and rectifying barriers are established in semi-conductive base wafers closely adjacent to the points of contact between sharpened wire points and the base wafers.

Previously difficulty has been encountered in attaching electrical leals to large area electrodes of semi-conductor devices. One method of attaching leads is merely to maintain them in contact with the electrodes by a light spring pressure. This construction is subject to several obvious disadvantages such as lack of rigidity and susceptibility to dislocation by jarring, vibration or thermal expansion and contraction. Also, an oxide coating upon an electrode may adversely affect the contact between the lead and the electrode. Another method in wide use is to solder leads to the electrodes with a low melting point solder such as "Cerrobend." Cerrobend is a solder comprising by weight 50% bismuth, 26.7% lead, 13.3% tin and 10% cadmium having a melting point of about 70° C. Such a solder is not suitable for use with devices that are subjected to relatively high temperatures during operation.

A further difficulty with all previously known methods of attaching leads to large area electrodes concerns etching. It has previously been found advantageous, and in many instances necessary in order to provide desirable electrical properties, to etch semi-conductor devices after their rectifying barriers have been formed. Etching reduces the thickness of the semi-conductor base wafer, weakening it and making the subsequent attaching of leads relatively more difficult. It is desirable therefore to attach the leads before etching. When this has been done previously, however, the rectifying barriers have been adversely affected by subsequent etching, apparently because of electrolysis between the solder or the leads and the base wafer. Previous practice therefore includes the steps of first etching the device and then attaching the leads. If the leads are soldered to the etched device a further disadvantage is encountered in heating unprotected exposed portions of the rectifying barriers of the device. Unprotected barriers are relatively sensitive to heating and sometimes may be effectively destroyed by temperatures as low as 80° C.

Accordingly, one object of the instant invention is to provide an improved method of attaching leads to large area electrodes of semi-conductor devices.

Another object is to provide improved leads which may be fused to large area electrodes of semi-conductor devices.

Another object is to provide an improved method of attaching leads to large area electrodes so that the devices may be etched after the leads are attached.

Still another object is to provide improved semi-conductor devices that may be subjected to relatively high temperatures without danger of damage to the connection between the electrodes and the leads of the device.

These and other objects may be accomplished by the practice of the instant invention according to which acid resistant electrical leads are attached to semi-conductor electrodes without the use of solder. According to the invention there is provided a lead composed entirely of or having a surface of a noble metal of the group consisting of ruthenium, rhodium, palladium, osmium, iridium, platinum and alloys of these metals. Such leads readily bond to all known electrode materials when such materials are heated to their melting points and are relatively inert with respect to all the etches used in semi-conductor treatment. These leads, therefore, may be readily attached to large area electrodes by heating the surfaces of the electrodes to their melting points and bringing the leads into contact with them. Devices may be etched after the leads are attached and no excessive heating is required after etching and before the devices are protected by a relatively thick coating of an insulating material.

The invention will be described in greater detail in connection with the accompanying drawing of which:

Similar reference characters are applied to similar elements throughout the drawing.

Figure 1:
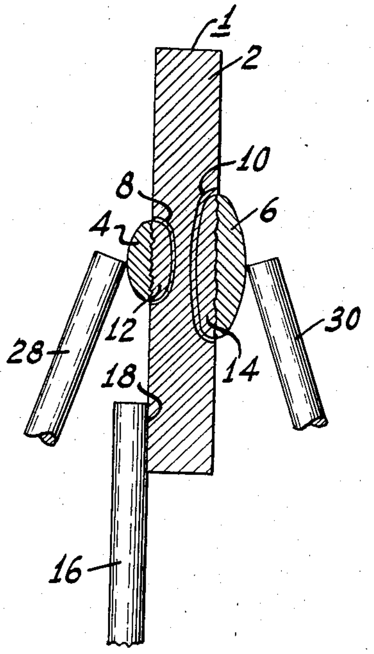
Figures 1 and 2 are schematic, elevational, cross-sectional views of a typical semi-conductor device illustrating two steps in attaching leads to the electrodes of the device.

A preferred embodiment of the invention comprises a method of attaching leads to the electrodes of an alloy junction type transistor as shown in the drawing. The device may be prepared according to any known method such as by heating two pellets of indium on opposite sides of a wafer of n-type semi-conductive germanium at about 500° C. for 1 to 10 minutes and attaching a base tab to the wafer by a non-rectifying solder connection. A typical device 1 produced by this method is shown in detail in Figures 1 and 2. It comprises a base wafer 2 of n-type semi-conductive germanium, an emitter electrode 4 and a collector electrode 6 each consisting of an alloy of indium and germanium, an emitter barrier 8 and a collector barrier 10. These bariers are p-n rectifying junctions and are disposed between the major n-type region of the germanium and the p-type recrystallized regions 12 and 14 respectively which are formed by the indium electrodes during the alloy process. A base tab 16 which may be of nickel is soldered by a substantially non-rectifying connection 18 to the germanium wafer.

Figure 2:
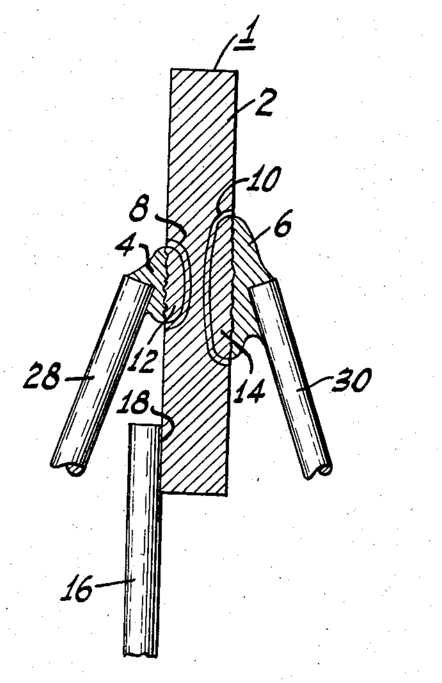
Figure 3:
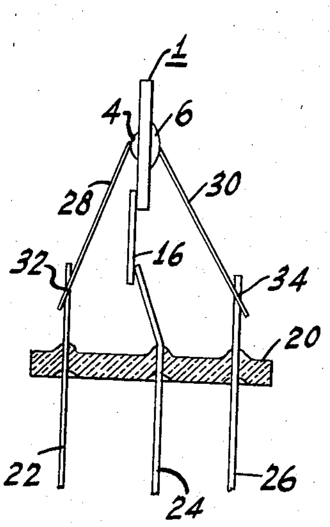
Figure 3 is a schematic, cross-sectional and elevational view of a typical semi-conductor device mounted on a base and having leads attached to its electrodes according to the invention.

As shown in Figure 3, a glass base 20 is provided having three connector pins 22, 24 and 26 sealed through it. The base may be of any convenient size such as about ¼" x ⅛" x 0.1" thick and the pins may be commercial Dumet wire or any other conductors suitable for sealing through glass. Dumet is the commercial name for glass sealing wire having a core of a 42% nickel-58% iron alloy and a borated copper sheath sufficiently thick to constitute about 21% to 26% of the total weight of the wire. The size of the pins is not critical. It is desirable, however, that they have sufficient strength and flexibility to withstand a reasonable amount of handling and bending. The pins are cleaned and two .003" diameter platinum coated molybdenum wire leads 28 and 30 are spot welded to the upper ends 32 and 34 of the two outer connector pins. The leads are drawn together, cut to equal length, and bent towards each other so that they cross. They are then spread lightly apart and the device 1 is placed between them so that the ends of the leads press lightly upon the centers of the electrodes. The center connector pin 24 is bent and brought into contact with the base tab 16 of the device. It is spot welded to the base tab to hold the device rigidly in position. The device is dipped in a flux such as a 25% zinc chloride aqueous solution and rinsed in 0.1 normal hydrochloric acid. The use of a flux is not essential but is preferred in order to insure more uniform results. The device is then heated at about 200° C. in a dry hydrogen atmosphere for about one minute. This heating melts the surface of the medium electrodes and bonds the platinum coated lead wires to the electrodes. The mounting is then complete and the device appears as shown in Figure 2.

The mounted device may be chemically or electro-etched in any desired solution and potted according to conventional practice. One etching procedure comprises immersing the device for about 30 seconds in a solution consisting of 45 parts concentrated nitric acid, 45 parts hydrofluoric acid and 10 parts water. Care should be taken, of course, not to immerse the nickel base tab or the connector pins in the etching solution since they may dissolve therein and provide metal ions that may deposit in metal form upon the device. The device may then be coated with coil dope and encased in a thermo-setting plastic material.

Electrical leads according to the invention may consist of solid noble metal wires or of wires of any metallic material coated with a non-porous layer of a noble metal or alloy. For the purposes of this specification the term, noble metals, is limited to include only ruthenium, rhodium, palladium, osmium, iridium, platinum and alloys of these metals. The thickness of the coating on coated wires is not in itself critical. It is critical, however, insofar as it affects the continuity of the coating since relatively thin coatings are apt to be discontinuous and porous.

The instant invention is not limited to attaching leads to the particular type of device described in connection with the preferred embodiment. It is broadly applicable to attaching leads to all known semi-conductor devices having large area electrodes as distinct from point contact electrodes. For example, devices similar to the one heretofore described in detail may comprise a base of p-type semi-conductive germanium and electrodes of antimony or of an alloy of lead and antimony. Also, many other metals and alloys may be used to form large area electrodes of semi-conductor devices. The practices of the invention is generally applicable to all such devices.

What is claimed is:

1. A method of attaching an electrical lead to a large area metallic electrode of a semi-conductor device comprising the steps of contacting a conductor lead to the surface of said electrode, said conductor lead having a substantially continuous surface of a material selected from the group consisting of ruthenium, rhodium, palladium, osmium, iridium, platinum and alloys thereof, and heating said electrode surface to at least its melting point thereby to cause said electrode surface to wet said conductor lead surface and to become bonded thereto.

2. The method according to claim 1 in which said electrical lead wire has a platinum surface.

3. The method of attaching an electrical lead having at least a surface composed of a metal selected from the group consisting of ruthenium, rhodium, palladium, platinum, osmium, indium and alloys thereof to a metallic electrode comprising indium fused to a surface of a semi-conductor device comprising the steps of contacting said electrical lead to the surface of said electrode, and heating said electrode in a dry hydrogen atmosphere to at least a temperature at which said electrode melts and wets said electrical lead.

4. A semi-conductor device comprising a body of crystalline semi-conductive material, a large area rectifying electrode upon a surface thereof and an electrical lead wire bonded to said electrode, said lead wire comprising molybdenum wire coated with platinum.

References Cited in the file of this patent

UNITED STATES PATENTS

| | | |
|---|---|---|
| 1,558,961 | Bullimore | Oct. 27, 1925 |
| 2,464,821 | Ludwick | Mar. 22, 1949 |
| 2,555,001 | Ohl | May 29, 1951 |
| 2,697,269 | Fuller | Dec. 21, 1954 |
| 2,714,183 | Hall et al. | July 26, 1955 |
| 2,731,704 | Spanos | Jan. 24, 1956 |
| 2,736,822 | Dunlap | Feb. 28, 1956 |

UNITED STATES PATENT OFFICE

CERTIFICATE OF CORRECTION

Patent No. 2,877,396 March 10, 1959

Lorne D. Armstrong et al.

It is hereby certified that error appears in the printed specification of the above numbered patent requiring correction and that the said Letters Patent should read as corrected below.

Column 1, line 32, after "electrical" for "leals" read -- leads --; column 3, line 20, before "electrodes" for "medium" read -- indium --.

Signed and sealed this 30th day of June 1959.

(SEAL)
Attest:

KARL H. AXLINE
Attesting Officer

ROBERT C. WATSON
Commissioner of Patents